US012625301B2

(12) United States Patent
Kunimune et al.

(10) Patent No.: US 12,625,301 B2
(45) Date of Patent: May 12, 2026

(54) WAVELENGTH CONVERSION MODULE

(71) Applicant: NICHIA CORPORATION, Anan (JP)

(72) Inventors: Teppei Kunimune, Tokushima (JP);
Yasuaki Kawata, Anan (JP)

(73) Assignee: NICHIA CORPORATION, Anan (JP)

( * ) Notice: Subject to any disclaimer, the term of this patent is extended or adjusted under 35 U.S.C. 154(b) by 966 days.

(21) Appl. No.: 17/869,709

(22) Filed: Jul. 20, 2022

(65) Prior Publication Data

US 2023/0041361 A1     Feb. 9, 2023

(30) Foreign Application Priority Data

Jul. 21, 2021     (JP) ................................. 2021-120944

(51) Int. Cl.
| | | |
|---|---|---|
| *G02B 5/28* | (2006.01) | |
| *C09K 11/77* | (2006.01) | |
| *G02B 1/14* | (2015.01) | |
| *H01S 5/00* | (2006.01) | |

(52) U.S. Cl.
CPC ............ *G02B 1/14* (2015.01); *C09K 11/7774* (2013.01); *H01S 5/0087* (2021.01)

(58) Field of Classification Search
None
See application file for complete search history.

(56) References Cited

U.S. PATENT DOCUMENTS

| | | |
|---|---|---|
| 6,049,038 A | 4/2000 | Suzuki |
| 10,208,900 B2 * | 2/2019 | Inoue ..................... H05B 33/14 |

| | | | |
|---|---|---|---|
| 2011/0216550 | A1 | 9/2011 | Koike et al. |
| 2015/0295153 | A1 | 10/2015 | Kuramoto et al. |
| 2016/0040857 | A1 | 2/2016 | Inoue et al. |
| 2016/0230945 | A1 | 8/2016 | Inoue et al. |
| 2016/0370696 | A1 | 12/2016 | Akiyama |
| 2017/0040502 | A1 | 2/2017 | Fujii et al. |
| 2018/0090905 | A1 | 3/2018 | Shimizu |
| 2019/0189866 | A1 | 6/2019 | Kuramoto et al. |
| 2019/0243224 | A1 | 8/2019 | Yamada et al. |
| 2019/0264894 | A1 | 8/2019 | Aketa |
| 2019/0294032 | A1 | 9/2019 | Hirano et al. |
| 2020/0058830 | A1 | 2/2020 | Furuyama |
| 2021/0018160 | A1 | 1/2021 | Takaku et al. |
| 2021/0323061 | A1 | 10/2021 | Kunimune et al. |

FOREIGN PATENT DOCUMENTS

| | | | |
|---|---|---|---|
| JP | 1999054662 | A | 2/1999 |
| JP | 2008-533270 | A * | 8/2008 |
| JP | 2012-089316 | A | 5/2012 |
| JP | 2013229174 | A | 11/2013 |
| JP | 5510646 | B2 | 6/2014 |
| JP | 2014157698 | A | 8/2014 |
| JP | 2014-194895 | A | 10/2014 |
| JP | 2015-060789 | A | 3/2015 |
| JP | 2015213157 | A | 11/2015 |
| JP | 2015-216353 | A | 12/2015 |

(Continued)

*Primary Examiner* — Tae H Yoon

(74) *Attorney, Agent, or Firm* — Spencer Fane LLP

(57) ABSTRACT

A wavelength conversion module includes a base, a wavelength conversion member consisting of a phosphor, and a bonding member including a metal part that bonds the base and the wavelength conversion member. A thickness of the wavelength conversion member is less than 100 μm.

19 Claims, 8 Drawing Sheets

(56)          References Cited

FOREIGN PATENT DOCUMENTS

| | | | |
|---|---|---|---|
| JP | 6164221 | B2 | 7/2017 |
| JP | 2017138470 | A | 8/2017 |
| JP | 2018-054788 | A | 4/2018 |
| JP | 2018-107298 | A | 7/2018 |
| JP | 2019-002952 | A | 1/2019 |
| JP | 2019086624 | A | 6/2019 |
| JP | 6536202 | B2 | 7/2019 |
| JP | 2019138327 | A | 8/2019 |
| JP | 2019207761 | A | 12/2019 |
| JP | 2020004497 | A | 1/2020 |
| JP | 2020-134823 | A | 8/2020 |
| JP | 2021-017385 | A | 2/2021 |
| JP | 2021-170587 | A | 10/2021 |
| WO | 2014065051 | A1 | 5/2014 |
| WO | 2018042826 | A1 | 3/2018 |
| WO | WO 2018/110316 | A1 * | 6/2018 |
| WO | 2018042825 | A1 | 12/2018 |
| WO | 2018230333 | A1 | 12/2018 |
| WO | 2019159441 | A1 | 8/2019 |

* cited by examiner

S10 | Wavelength Conversion Member Preparation Step

S11 | First Film Formation Step

S12 | Grinding Polishing Preparation Step

S13 | Grinding Polishing Step

S14 | Second Film Formation Preparation Step

S15 | Second Film Formation Step

S16 | Dicing Preparation Step

S17 | Dicing Step

11

S20 | Base Preparation Step

S21 | First Application Step

S22 | Arrangement Step

S23 | Bonding Step

S24 | Impregnation Step

WAVELENGTH CONVERSION MODULE

CROSS-REFERENCE TO RELATED APPLICATION

This application claims priority to Japanese Patent Application No. 2021-120944 filed on Jul. 21, 2021, the disclosure of which is hereby incorporated herein by reference in its entirety.

BACKGROUND

The present disclosure relates to a wavelength conversion module.

In recent years, as a light source for headlights, various illumination devices, laser projectors, etc., for example, a light source having a high output such that blue light from a semiconductor laser is wavelength-converted by a phosphor have been widely used. In this light source, a phosphor generates heat in accordance with the wavelength conversion, so it has been required to efficiently exhaust the heat generated in the phosphor. In particular, in a wavelength conversion device used in the light source using the semiconductor laser, it has been required to use a wavelength conversion member having good durability and to efficiently exhaust the heat generated in the wavelength conversion member.

In response to these requirements, Japanese Patent Application Publication No. 2019-207761 discloses a wavelength conversion device (also referred to as a wavelength conversion module) in which a ceramic phosphor is used as a wavelength conversion member, and the ceramic phosphor is bonded to a heat dissipation member by a bonding member having a sintered structure. According to the above publication, a high thermal conductivity can be obtained by using the bonding member having the sintered structure including at least one of silver, gold, and copper.

SUMMARY

A higher output light source is required, and a wavelength conversion module having a wavelength conversion member used for such a light source is also required to have higher reliability. Therefore, an object of the present disclosure is to provide a highly reliable wavelength conversion module.

A wavelength conversion module according to the present disclosure includes a base, a wavelength conversion member consisting of a phosphor, and a bonding member including a metal part, the bonding member bonding the base and the wavelength conversion member, A thickness of the wavelength conversion member is less than 100 μm.

The wavelength conversion module configured as described above can have high reliability.

BRIEF DESCRIPTION OF DRAWINGS

Figure 1:
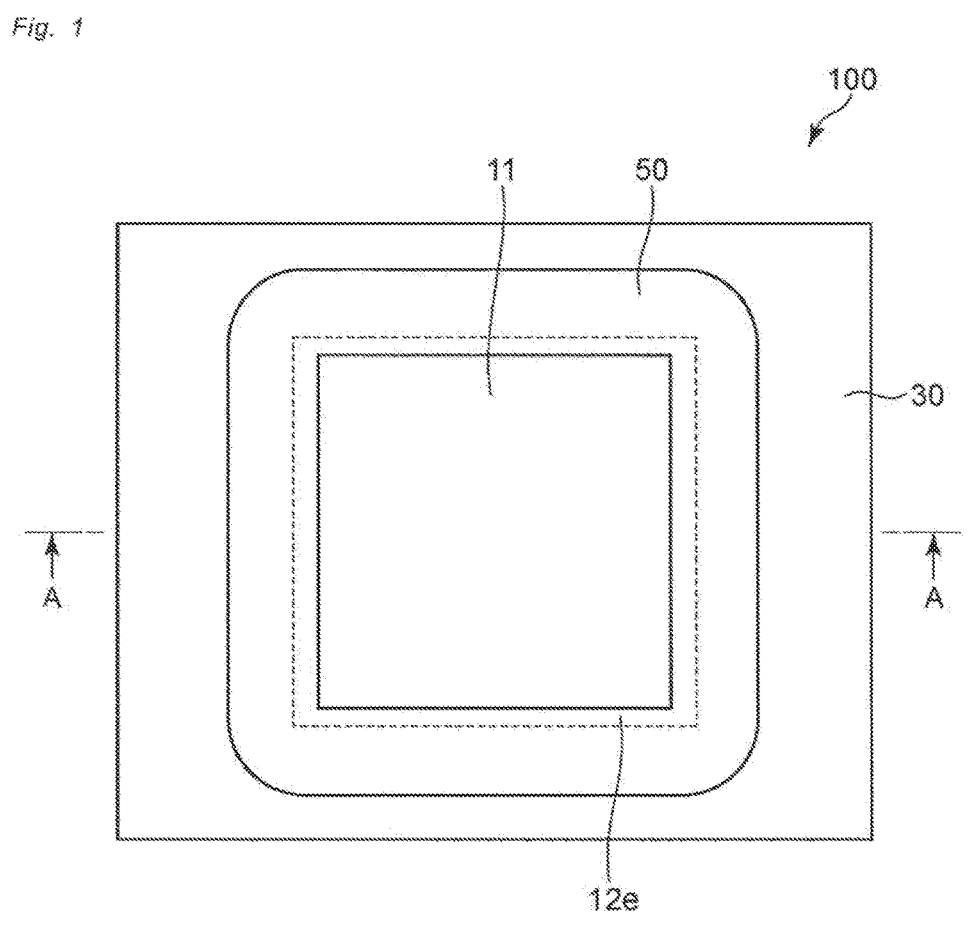

FIG. 1 is a top view of a wavelength conversion module according to the present disclosure.

DETAILED DESCRIPTION

Figure 2A:
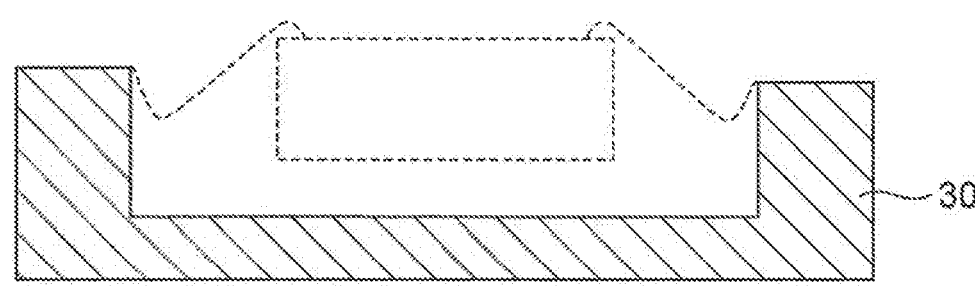
FIG. 2A is a schematic cross-sectional view of a base used for a wavelength conversion module base.
Figure 2B:
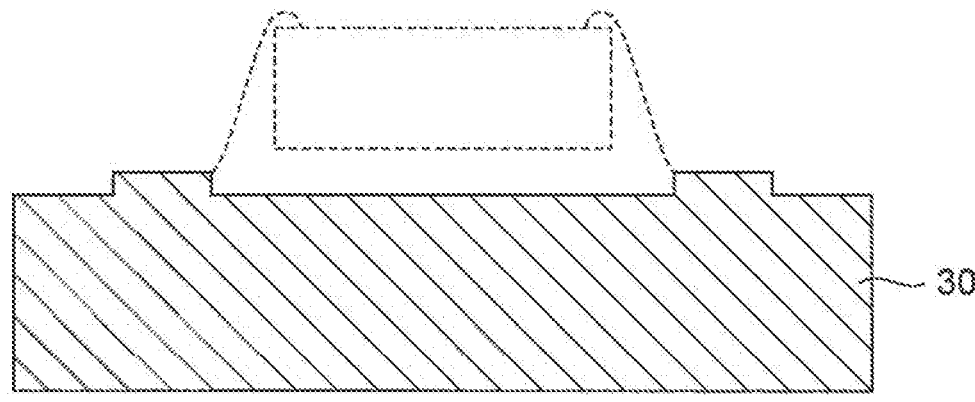
FIG. 2B is a schematic cross-sectional view of a base of another embodiment.
Figure 2C:
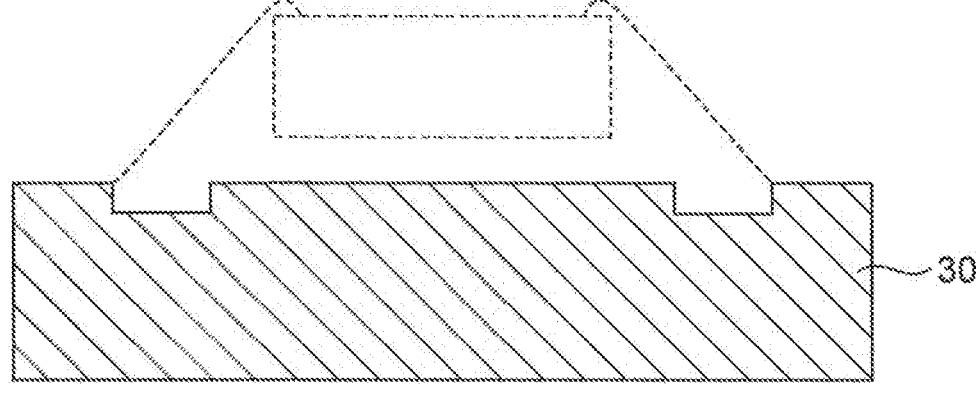
FIG. 2C is a schematic cross-sectional view of a base of yet another embodiment.

Hereinafter, exemplary embodiments and examples for carrying out the present disclosure will be described with reference to the drawings. Note that the wavelength conversion module described below is merely intended to embody the technical concept of the present disclosure, and the present disclosure is not limited to the following features unless otherwise specified.

In each drawing, members having identical functions may be denoted by the same reference signs. In view of the ease of explanation or understanding of the points of view, the exemplary embodiments and examples may be illustrated separately for convenience, but the partial substitutions or combinations of the configurations illustrated in different exemplary embodiments and examples are possible. In the exemplary embodiments and examples described below, descriptions of matters common to those already described will be omitted, and only different features are described. In particular, the same action effects according to similar configurations shall not be mentioned sequentially for each exemplary embodiment and example. The size, positional relationship, etc., of the members illustrated in the drawings may be exaggerated in order to clarify explanation.

Hereinafter, exemplary embodiments according to the present disclosure will be described in detail.

A light wavelength conversion device in which a thickness of a ceramic phosphor is 100 μm or greater and 500 μm or less is described, for example, in Japanese Patent Application Publication No. 2019-207761 described above. When the ceramic phosphor is irradiated with laser and the reflected light thereof is extracted, heat is generated at a surface of the ceramic phosphor. In addition, when the thickness of the ceramic phosphor is increased, a distance from the surface of the ceramic phosphor to a substrate having a high heat dissipation property on which the ceramic phosphor is mounted is long, so that it is difficult to exhaust the heat. Although it is conceivable to reduce the thickness of the phosphor in consideration of heat exhaustion, ceramic to be used as a phosphor material has lower rigidity than a silicon substrate, a sapphire substrate, etc., and thus is difficult to handle in a state after thinning, so that reduction in thickness of the phosphor is difficult to be realized.

The present invention according to the present disclosure has been obtained as a result of diligent research based on the knowledge described above, and allows for achieving thinning of the wavelength conversion member consisting of the phosphor and efficiently exhausting heat generated in the wavelength conversion member. Accordingly, the highly reliable wavelength conversion module can be provided.

As a specific configuration of effectively exhibiting this function, a wavelength conversion module 100 includes a base 30, a wavelength conversion member 11 consisting of a phosphor, and a bonding member 20 including a metal part 21 and bonding the base 30 and the wavelength conversion member 11. A thickness of the wavelength conversion member 11 is less than 100 μm. With the thickness of the wavelength conversion member 11 of less than 100 μm, heat generated in the wavelength conversion member 11 can be efficiently exhausted. More specific embodiments are described in detail below with reference to FIGS. 1 to 3B.

Base

Figure 3A:
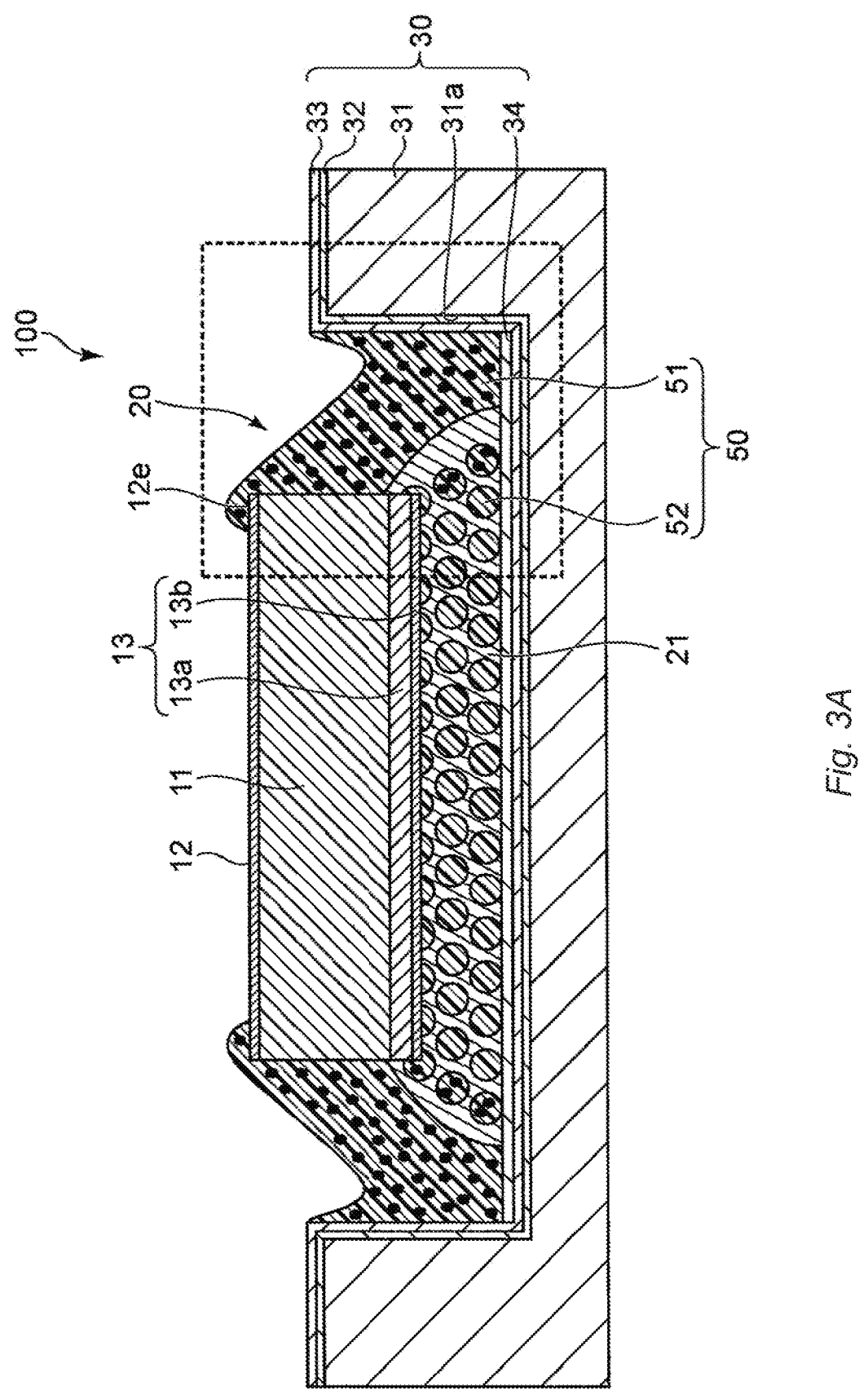
FIG. 3A is a schematic cross-sectional view taken along line A-A of the wavelength conversion module illustrated in FIG. 1.
Figure 3B:
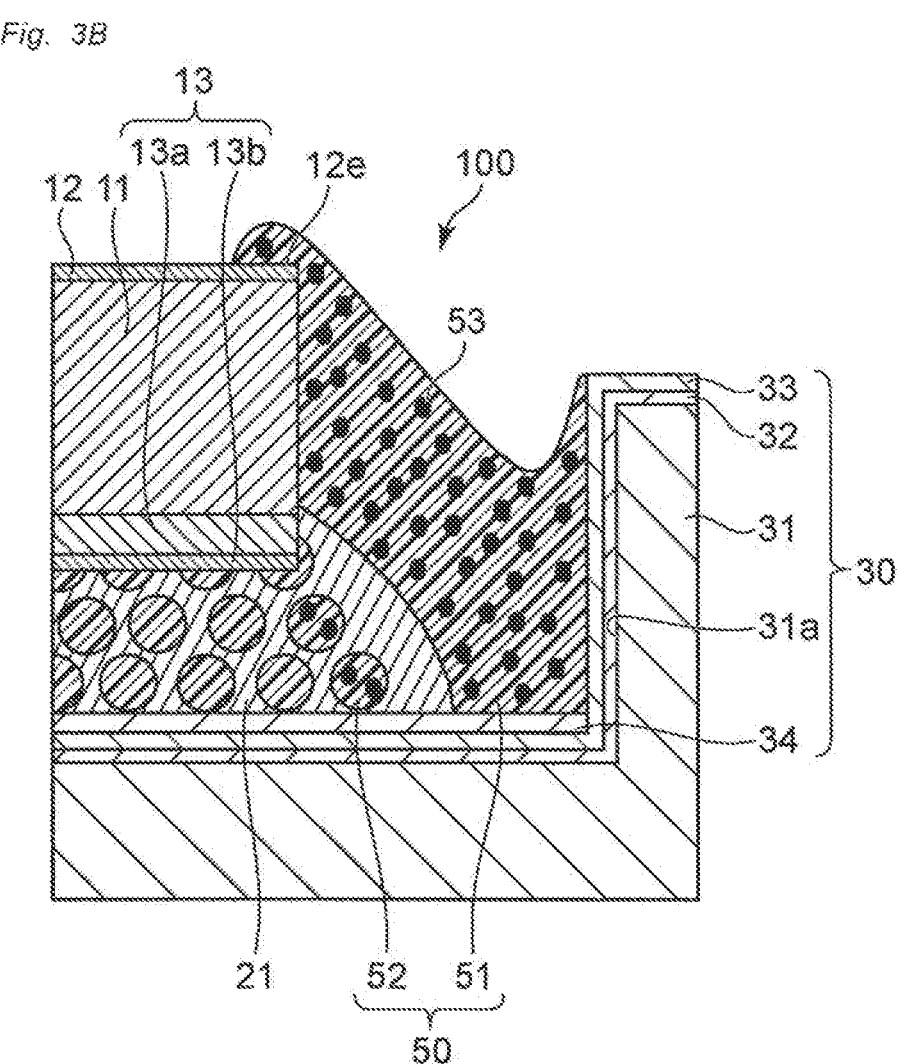
FIG. 3B is an enlarged cross-sectional view of a portion of the cross-sectional view of FIG. 3A.

The base 30 may include a base member 31 having a recess 31a, a first metal layer 32 provided on an upper surface of the base member 31 including an inner surface defining the recess 31a, and a second metal layer 33 provided at the first metal layer 32 (see FIGS. 3A and 3B). The base member 31 is preferably made of copper or a copper alloy in terms of heat dissipation and processability. The first metal layer 32 is, in one example, made of nickel (Ni), and preferably has a thickness in a range of 0.1 μm to 3.0 μm. The second metal layer 33 is, in one example, made of gold (Au), and preferably has a thickness in a range of 0.02 μm to 5.0 μm. Furthermore, a third metal layer 34, which adjusts a spacing between the base 30 and the wavelength conversion member 11, may be provided on the second metal layer 33. As an example of the third metal layer 34, silver (Ag) may be used, and the thickness can be appropriately set according to the spacing between the base 30 and the wavelength conversion member 11. For example, the thickness of the third metal layer 34 is preferably in a range from 0.1 μm to 100 μm, but the third metal layer 34 may not be provided.

The base described in the present embodiment has a package structure having an annular protruding portion for forming the recess 31a. Alternatively, for example, it is preferable to form an annular protruding portion (see FIG. 2B) or a recessed portion (see FIG. 2C) having a structure with a height smaller than the annular protruding portion for forming the recess, which is formed at the upper surface of the base (substrate) instead of the annular protruding portion for forming the recess. The annular protruding portion or recessed portion having the low profile structure may be lower than a thickness of a metal sintered compact. With the annular protruding or recessed portion, the spread of a resin can be stopped by surface tension when the resin is formed.

Wavelength Conversion Member

The wavelength conversion member 11 consists of a phosphor. In the present specification, the expression "the wavelength conversion member consists of a phosphor" does not exclude inevitable mixing of a component other than the phosphor, and the content of the component other than the phosphor is, for example, 0.05% by weight or less.

The wavelength conversion member 11 is preferably a polycrystalline body, and is, for example, a rare earth aluminate sintered compact having a composition represented by Formula (I):

$$(\mathrm{Ln}_{1-n}\mathrm{Ce}_n)_3(\mathrm{Al}_{1-m}\mathrm{M}^1_m)_5\mathrm{O}_{12} \qquad \text{(I)}$$

(In Formula (I), Ln is at least one rare earth element selected from the group consisting of Y, La, Lu, Cd, and Tb; M1 is at least one element selected from Ga and Sc; and in and n are numbers that satisfy $0 \leq m \leq 0.02$ and $0.0017 \leq n \leq 0.0170$, respectively).

The wavelength conversion member 11 can be made of a YAG plate formed of a sintered compact of yttrium aluminum garnet and an LAG plate formed of a sintered compact of lutetium aluminum garnet, which is selected according to the configuration of the projector to be used. Specifically, a laser light source, etc., is used as the red light source, and the wavelength conversion member 11 is formed of the LAG plate when only green light is used as the fluorescent light, or the YAG plate when both green light and red light are used as the fluorescent light. The thickness of the wavelength conversion member 11 is less than 100 μm, which will be described in detail below. The thickness of the wavelength conversion member 11 is preferably less than 95 μm, more preferably less than 80 μm, and even more preferably less than 70 μm. Further, the thickness of the wavelength conversion member 11 is, for example, 20 μm or more. Still further, the Ce content (mol %) of the phosphor in the wavelength conversion member 11 is calculated by $n \times 3 \times 100/(3+5+12)$ using a Ce substitution ratio n described above, and is preferably in a range from 0.025 mol % to 0.255 mol %. Such a Ce content allows for reducing a decrease in luminous efficiency at high temperatures, and thus is suitable for high output laser excitation applications.

The relative density of the rare earth aluminate sintered compact is in a range from 85% to 99%, preferably 89% or more, more preferably 90% or more, even more preferably 91% or more, and particularly preferably 92% or more. When the relative density of the rare earth aluminate sintered compact is in a range from 85% to 99%, excitation light incident on the rare earth aluminate sintered compact is efficiently scattered by voids, the scattered light is efficiently wavelength-converted by the crystalline phase, and the wavelength-converted light can be emitted from the same surface as the surface on which the excitation light is incident.

The relative density of the rare earth aluminate sintered compact can be calculated from the apparent density of the rare earth aluminate sintered compact and the true density of the rare earth aluminate sintered compact according to equation (1) below.

Equation 1

The relative density of the rare earth aluminate sintered compact (%)=(the apparent density of the rare earth aluminate sintered compact÷the true density of the rare earth aluminate sintered compact)×100    (1)

The apparent density of the rare earth aluminate sintered compact is a value obtained by dividing the mass of the rare earth aluminate sintered compact by the volume of the rare earth aluminate sintered compact, and can be calculated by the following equation (2). As the true density of the rare earth aluminate sintered compact, the true density of the rare earth aluminate phosphors can be used.

Equation 2

The apparent density of the rare earth aluminate sintered compact=the mass of the rare earth aluminate sintered compact (gram)÷the volume of the rare earth aluminate sintered compact (Archimedes method) (cm$^3$)      (2)

The rare earth aluminate sintered compact preferably has a void ratio in a range from 1% to 15%. The void ratio of the rare earth aluminate sintered compact is a value obtained by subtracting the relative density of the rare earth aluminate sintered compact from 100%, and can be calculated by the following equation (3), if necessary.

Equation 3

The void ratio of the rare earth aluminate sintered compact (%)=100%−the relative density of the rare earth aluminate sintered compact (%)      (3)

In the rare earth aluminate sintered compact, the voids are preferably dispersed around the crystalline phase. When the voids are dispersed around the crystalline phase, the excitation light incident on the rare earth aluminate sintered compact is scattered by the voids dispersed around the crystalline phase, and the dispersed light is efficiently wavelength-converted by the crystalline phase, so that the wavelength-converted light can be emitted from the same surface as the surface on which the excitation light is incident.

Bonding Member

The bonding member 20 bonds the base 30 and the wavelength conversion member 11, and includes the metal part 21. The metal part 21 is preferably a material having good thermal conductivity in order to transmit heat generated in the wavelength conversion member 11 to the base 30. As an example, the metal part 21 preferably includes silver (Ag) or copper (Cu), and more preferably includes silver (Ag).

Metal

The metal part 21 is preferably a metal sintered compact having a porous structure including voids. The term "metal sintered compact having the porous structure" as in the present disclosure is, for example, obtained by firing and sintering a metal paste containing a metal powder, containing a metal portion having a network structure in which a plurality of metal powders are continuously connected by fusing at least portions of the adjacent metal powders, and the voids are formed between the adjacent metal powders excluding the fused portions. Thus, for example, the metal sintered compact having the porous structure according to the present disclosure includes the voids between the wavelength conversion member and the base (heat dissipation member), for example, in the wavelength conversion module.

Further, the porous material generally refers to a material having a large number of pores, and is referred to as, for example, a microporous material, a mesoporous material, or a macroporous material, but the metal sintered compact in the present disclosure may contain voids having various sizes, for example, depending on the particle size distribution of the metal powder body before sintering. Furthermore, for example, when the metal sintered compact in the present disclosure is used as a bonding member that bonds two members, the voids are also present in the portion sandwiched between the two members, which makes it possible to more effectively ensure strength that can withstand thermal stress.

The metal part 21 may have a fillet extending toward the surface defining the bottom of the recess 31a of the base 30. The fillet may cover at least a portion of the side surface of the wavelength conversion member 11. The "fillet" described in the present specification refers to a portion of the metal part 21 protruding outward from the side surface of the wavelength conversion member 11, and having a substantially triangular shape in cross-section that decreases in size (height) from the wavelength conversion member 11 side toward the lower side away from the wavelength conversion member 11.

The metal part 21 may contain spacer particles to make the bonding member 20 have a certain thickness or more. Thereby, the thickness of the metal part 21 between the base 30 and the wavelength conversion member 11, that is, the thickness of the bonding member 20, can be the same or thicker than the particle size of the spacer particles. The spacer particles can be composed of zirconia particles, glass particles, silica particles, alumina particles, and preferably composed of zirconia particles. The particle size of the spacer particles is set as appropriate in consideration of the spacing of the base and the wavelength conversion member to be ensured, but is set, for example, in a range from 20 μm to 500 μm, preferably in a range from 50 μm to 300 μm, and more preferably in a range from 100 μm to 200 μm.

Resin

A resin 50 (a resin part) may be included as a suitable bonding member 20, in addition to the metal part 21. The resin 50 increases a bonding area between the base 30 and the wavelength conversion member 11 to allow firm bonding. The resin 50 preferably includes a first resin portion 51 covering the outer surface of the metal part 21, and second resin portions 52 impregnated in the voids of the metal sintered compact constituting the metal part 21. In the illustrated example (see FIG. 3B), the first resin portion 51 may further cover the side surface of the wavelength conversion member 11.

The thickness of the first resin portion 51 (the shortest distance from the fillet surface of the metal part 21 to the surface of the first resin portion 51) is preferably 1 μm or more. When the thickness of the first resin portion 51 is sufficient, the metal part 21 is blocked from the outside air, and thus the metal part 21 can be protected from sulfurization and oxidation. Note that the thickness of the first resin portion 51 can be confirmed by, for example, a cross-sectional SEM, etc.

The second resin portions 52 are impregnated in the voids of the metal sintered compact constituting the metal part 21, which can increase the durability of the thermal stress. Here, as can be appreciated from the fact that the second resin portions 52 are impregnated in the voids of the metal sintered compact, the bonding between the wavelength conversion member 11 and the base 30 is mainly performed by the metal part 21. In other words, the volume ratio of the second resin portions 52 is preferably smaller than the volume ratio of the metal part 21.

The main component of the resin 50 (the first resin portion 51 and the second resin portions 52) is, for example, a thermosetting epoxy resin. A silicone resin, etc., may also be used, but the epoxy resin is more preferable because the epoxy resin has a high gas barrier property and can shield the metal sintered compact from the outside air after impregnation into the metal sintered compact. The thermosetting epoxy resin preferably does not contain halogen such as chlorine. Examples of the type of epoxy resin include alicyclic, bisphenol A diglycidyl ether, bisphenol F diglycidyl ether, hydrogenated bisphenol A diglycidyl ether, hexahydrophthalate-diglycidyl ester, etc., and various epoxy reactive diluents may be added as liquid products. Among these epoxy resins, the alicyclic epoxy resin is preferable. Because the alicyclic epoxy resin has a low viscosity, and thus has high filling property, so that the voids are less likely to occur. In addition, the glass transition temperature can be raised to 200° C. or more, and the glass transition temperature can be easily adjusted according to the required heat resistant temperature.

Particles Dispersed in Resin

The resin 50 may contain dispersed particles 53. The particles 53 are preferably particles contained in an anti-foaming agent that effectively suppresses the generation of bubbles. As an anti-foaming agent, for example, hydrophilic or hydrophobic particles (powder) may be blended and dispersed in a medium such as silicone oil. In the example herein, in addition to the silicone oil, a highly hydrophobic surfactant can be used as a medium. The former, silicone oil, is an anti-foaming agent suitable for non-aqueous systems, whereas the latter, the highly hydrophobic surfactant, is a foam suppressor anti-foaming agent suitable for aqueous systems. In the present embodiment, it is preferable to use the silicone oil because most of the resin material corresponds to the non-aqueous system. Also, hydrophilic silica, hydrophobic silica, etc., may be used as the hydrophilic or hydrophobic particles. Anti-foaming agents include a foam suppressor anti-foaming agent that can effectively suppress the generation of the foam and a foam-breaking anti-foaming agent that effectively breaks the foam, but it is preferable to use the foam suppressor anti-foaming agent in consideration of scattering, etc. of the resin material.

Furthermore, the average particle size of the hydrophilic or hydrophobic particles dispersed in the medium is appropriately set in consideration of the size of the voids of the target object to be impregnated and the particle settling during storage, but is, for example, in a range from 0.001 μm to 20 μm, preferably in a range from 0.01 μm to 10 μm and more preferably in a range from 0.05 μm to 5 μm. The content of the hydrophilic or hydrophobic particles is, for example, in a range from 0.001 parts by weight to 10 parts by weight, preferably in a range from 0.01 parts by weight to 5 parts by weight, and more preferably in a range from 0.1 parts by weight to 3 parts by weight, relative to 100 parts by weight of the medium.

The particles 53 may be included in any of the first resin portion 51 and the second resin portions 52, but the second resin portions 52 do not include almost the particles 53 in the interior of the metal part 21, and the particles 53 are disposed in the resin near the outer surface of the metal part 21. That is, in the second resin portion 52, the density of the particles 53 included in the second resin portions 52 near the outer surface of the metal part 21 is greater than the density of the particles 53 contained in the second resin portions 52 inside the metal part 21. Further, the density of the particles 53 dispersed in the first resin portion 51 is greater than the density of the particles 53 dispersed in the second resin portions 52 inside the metal part 21.

Furthermore, the dispersed particles 53 have a function of acting on the surface of the foam when the foam of the resin material for forming the resin 50 when manufacturing the wavelength conversion module reaches the liquid surface, thereby destabilizing the foam surface by disturbing the arrangement and suppressing the growth of foam from the liquid surface. The foam suppression function of the particles 53 in the resin part may be exhibited within the first resin portion 51, and thus the second resin portions 52 may not substantially include the particles 53.

Other Additional Configurations

Protective Film

In one aspect, a protective film 12 may be provided at the upper surface (an irradiation surface or an emission surface) of the wavelength conversion member 11 from the perspective of protecting the wavelength conversion member 11. The protective film 12 may act as an anti-reflective layer, for example, can be composed of, for example, a metal oxide such as $SiO_2$, $Nb_2O_5$, $TiO_2$, or a nitride such as SiN, GaN, AlN, and is preferably composed of $SiO_2$. Furthermore, the protective film 12 may be composed of a single layer, but may be composed of a plurality of layers by layering a plurality of the above materials. The thickness of the protective film 12 is preferably a thickness that functions as an antireflection layer. For example, in the case of an $SiO_2$ single layer, the thickness of the protective film 12 is preferably in a range from 0.05 μm to 0.20 μm.

An outermost surface of the protective film 12 is preferably an oxide. Since the oxide generally has a large contact angle with respect to the resin, the oxide can reduce the wettability with respect to the resin. Therefore, the resin adhesion to and contamination of the outermost surface of the protective film 12 at the position irradiated with the light and the position where the light is emitted can be reduced. The outermost surface of the protective film 12 is, for example, $SiO_2$.

The resin 50 of the bonding member 20 may be disposed at an outer peripheral portion 12e of the outermost surface of the protective film 12 (see FIGS. 1 to 3B). For example, the present embodiment describes an aspect in which the first resin portion 51 of the resin 50 covers the side surface of the wavelength conversion member 11, the side surface of the protective film 12, and the outer peripheral portion 12e of the outermost surface of the protective film 12. The term "outer peripheral portion" described in the present specification is intended to be a position that does not hinder the light irradiation of the wavelength conversion member and the emission of light from the wavelength conversion member. More specifically, in general, the spot size of the laser light is used around φ2 mm, and it is desirable that no organic matter is present within φ3 mm from the center of the wavelength conversion member surface including the deviation at the time of assembling the members. That is, a region of φ3 mm or more from the center of the wavelength change member surface can be referred to as an outer peripheral portion. In yet another aspect, the outer peripheral portion refers to a region of, for example, 35% or less relative to the length of the wavelength conversion member 11. Thus, disposing the resin 50 of the bonding member 20 on the outer peripheral portion 12e of the outermost surface of the protective film 12 can increase the bonding area between the wavelength conversion member 11 and the bonding member 20, and thus can be more firmly bonded. On the other hand, as described above, since irradiation and emission of light are performed, it is not preferable to dispose the resin 50 in a region inside the outer peripheral portion 12e.

Bonding Layer

A bonding layer 13 may be provided at the lower surface (a surface facing the base 30) of the wavelength conversion member 11. The bonding layer 13 includes a transparent reflective layer 13a and a metal bonding layer 13b provided at a lower surface of the transparent reflective layer 13a. The transparent reflective layer 13a can be composed of, for example, an $Al_2O_3$ film, an $SiO_2$ film, an $Nb_2O_5$ film, or a $TiO_2$ film, and is preferably composed of an $Al_2O_3$ film. The transparent reflective layer 13a is a transparent layer, and has a function of reflecting at least part of light from the wavelength conversion member 11 by an interface. The reflection of light by the transparent reflective layer 13*a* is reflection with less light absorption compared to the reflection of light by the metal, and thus light can be efficiently reflected. The transparent reflective layer 13*a* is preferably in a range from 0.1 μm to 5.0 μm. The metal bonding layer 13*b* can be composed of, for example, an Ag film, a laminate of an Ni film and an Ag film, a laminate of an Ag film and an Au film, a laminate of an Al film and an Ag film, an Au film, a laminate of an Al film and an Au film, or a laminate in which any metal layer is sandwiched between the laminates as a barrier layer for light reflection, adhesion, or heating, and is preferably composed of an Ag film. The thickness of the metal bonding layer 13*b* is preferably in a range from 0.1 μm to 100 μm.

In the wavelength conversion module 100 configured as described above, since the thickness of the wavelength conversion member 11 is less than 100 μm, heat generated in the wavelength conversion member 11 can be efficiently exhausted. Measurement results related to the heat exhaustion when the thickness of the wavelength conversion member 11 is less than 100 μm will be described in detail in Examples.

Subsequently, a manufacturing method for a wavelength conversion module including the wavelength conversion member 11, the protective film 12, and the bonding layer 13 will be described. A step of forming the protective film 12 and the bonding layer 13 at the wavelength conversion member 11 will be described.

Step of Forming Protective Film 12 and Bonding Layer 13 at Wavelength Conversion Member 11

Figure 4A:
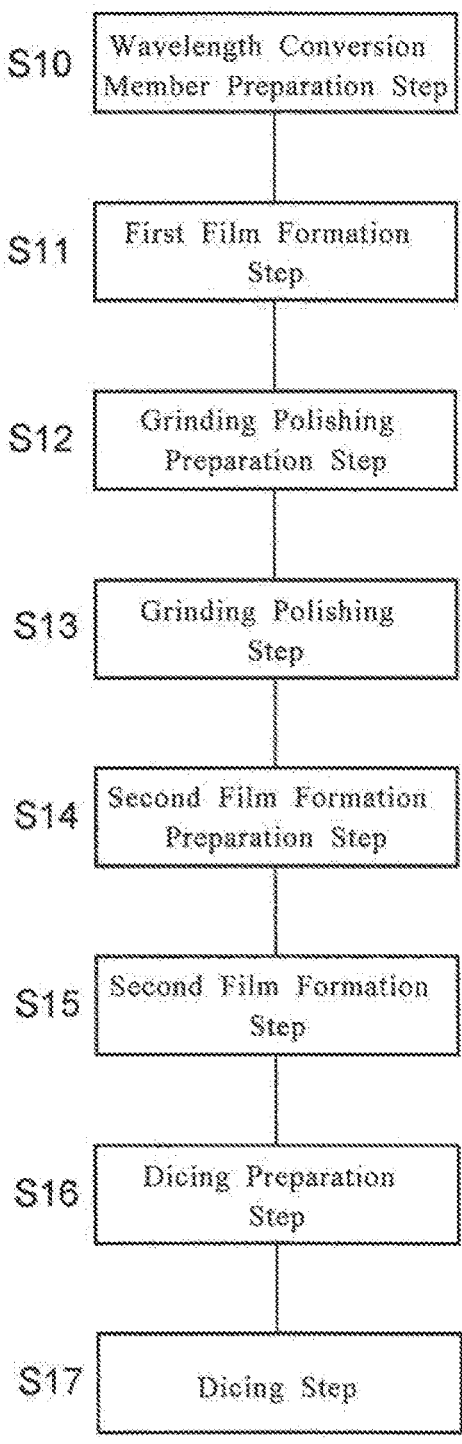
FIG. 4A is a flowchart illustrating a process of a manufacturing method for the wavelength conversion module.

The step of forming the protective film 12 and the bonding layer 13 at the wavelength conversion member 11 includes a wavelength conversion member preparation step S10, a first film formation step S11, a grinding polishing preparation step S12, a grinding polishing step S13, a second film formation preparation step S14, a second film formation step S15, a dicing preparation step S16, and a dicing step S17, as illustrated in FIG. 4A.

Figure 4B:
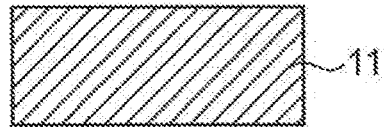
FIG. 4B is a schematic cross-sectional view illustrating a state after a wavelength conversion member preparation step.

Wavelength Conversion Member Preparation Step S10 (see FIG. 4B)

The wavelength conversion member 11 consisting of a phosphor is provided. As described above, the wavelength conversion member 11 preferably consists of the polycrystalline body. Furthermore, the phosphor preferably includes YAG or LAG. The wavelength conversion member 11 consisting of a phosphor has low rigidity compared to a silicon substrate, a sapphire substrate, etc., and thus, for example, the wavelength conversion member 11 having a thickness of 200 gum or more is prepared from the perspective of ease of handling. It is desirable that at least one side of the wavelength conversion member 11 is polished by 10 μm or more with a #22000 grindstone at a grindstone feed rate in a range from 1 μm/min to 10 μm/min. Since the surface is smooth if such processing is performed, uniform film formation can be performed in the first film formation step.

Figure 4C:
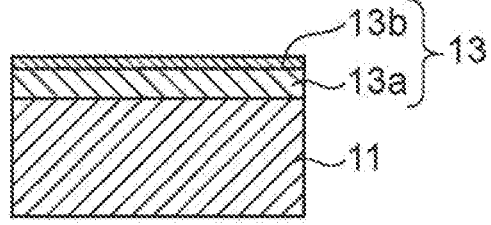
FIG. 4C is a schematic cross-sectional view illustrating a state after a first film formation step.

First Film Formation Step S11 (see FIG. 4C)

Subsequently, the transparent reflective layer 13*a* is formed with respect to the wavelength conversion member 11. The transparent reflective layer 13*a* is formed into a film in a thickness range from 0.1 μm to 5.0 μm by using a known film formation method (for example, a sputtering film formation method). The metal bonding layer 13*b* is formed after the film formation of the transparent reflective layer 13*a*. The metal bonding layer 13*b* is selected from, for example, an Ag film, a laminate of a Ni film and an Ag film, a laminate of an Ag film and an Au film, a laminate of an Al film and an Ag film, an Au film, and a laminate of an Al film and an Au film, and is formed by using a known film formation method (e.g., sputtering film formation) in a range from 0.1 μm to 100 μm.

Figure 4D:
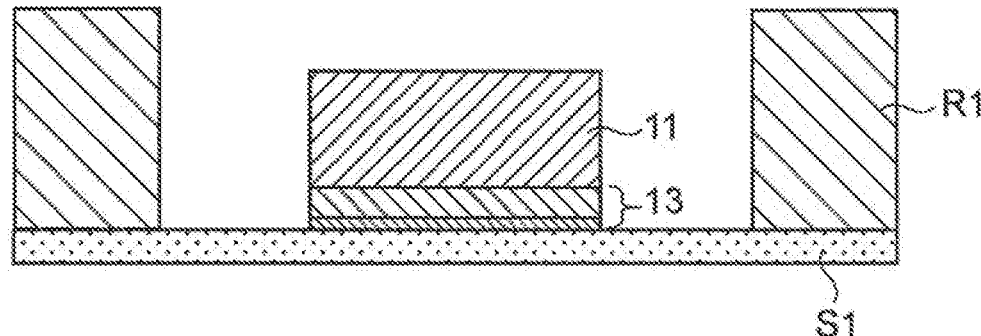
FIG. 4D is a schematic cross-sectional view illustrating a state after a grinding polishing preparation step.

Grinding Polishing Preparation Step S12 (see FIG. 4D)

For the wavelength conversion member 11 at which the bonding layer 13 (the transparent reflective layer 13*a* and the metal bonding layer 13*b*) is formed, a preparation step for performing grinding polishing on the wavelength conversion member 11 side is performed. The bonding layer 13 is attached to an adhesive sheet S1 with a metal ring R1. Here, as the adhesive sheet S1, a sheet whose adhesive strength is reduced by being irradiated with UV light is adopted. The metal ring R1 is a ring for holding the adhesive sheet S1.

Figure 4E:
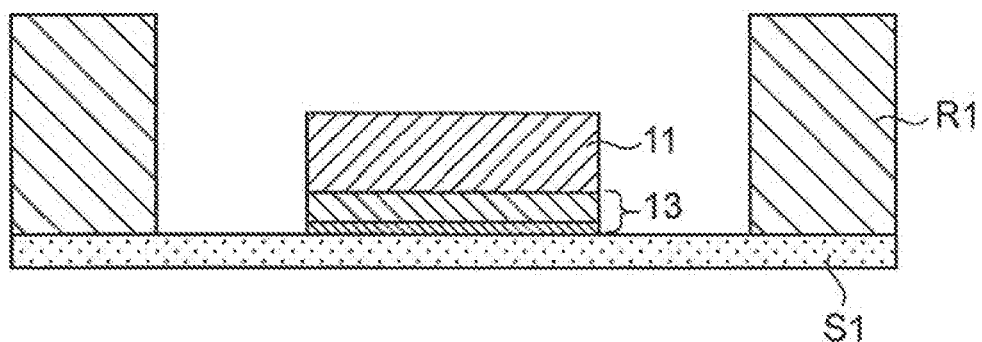
FIG. 4E is a schematic cross-sectional view illustrating a state after a grinding polishing step.

Grinding Polishing Step S13 (see FIG. 4E)

After the grinding polishing preparation step S12, the grinding polishing step S13 is performed. According to the grinding polishing step S13, the wavelength conversion member 11 is processed to a thickness of less than 100 μm. Upon the grinding polishing, the wavelength conversion member consisting of phosphor has low rigidity, and thus grinding is first performed using a #1500 grindstone at a grindstone feed speed in a range from 30 μm/min to 48 μm/min until the target thickness of 10 μm is reached. However, when the target thickness is less than 100 μm, the grinding is stopped at 100 μm regardless of the target thickness in order to prevent cracking due to the grinding load. Subsequently, polishing is preferably performed to a target thickness using a #22000 grindstone at a grindstone feed speed in a range from 1 μm/min to 10 μm/min.

Figure 4F:
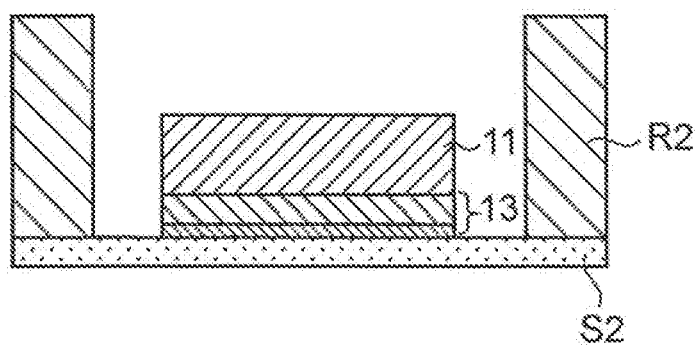
FIG. 4F is a schematic cross-sectional view illustrating a state after a second film formation preparation step.

Second Film Formation Preparation Step S14 (see FIG. 4F)

After the grinding polishing step S13, the second film formation preparation step S14 is performed. In order to replace the adhesive sheet S1 used in the grinding polishing step with a new adhesive sheet, first, the adhesive sheet S1 is irradiated with UV light to reduce its adhesiveness, and then a new adhesive sheet having less adhesiveness than the adhesive sheet S1 is attached to the surface where grinding polishing is applied. After that, the adhesive sheet S1 is peeled off by turning it upside down. Thereafter, a new adhesive sheet S2 is attached to the bonding layer 13, and the adhesive sheet attached to the surface where the grinding polishing is applied is removed. Here, as the adhesive sheet S2, a sheet whose adhesive strength is reduced by being irradiated with UV light is adopted. Then, a metal ring R2 having a smaller diameter than the metal ring R1 is attached to prevent interference with the metal ring R1, and the sheet on the metal ring R1 side is cut. In this manner, the adhesive sheet S2 with the metal ring R2 attached to the bonding layer 13 is prepared. Note that, as the adhesive sheet S2, it is preferable to use an adhesive sheet for vacuum in correspondence with the film formation apparatus used in the second film formation step described later.

Figure 4G:
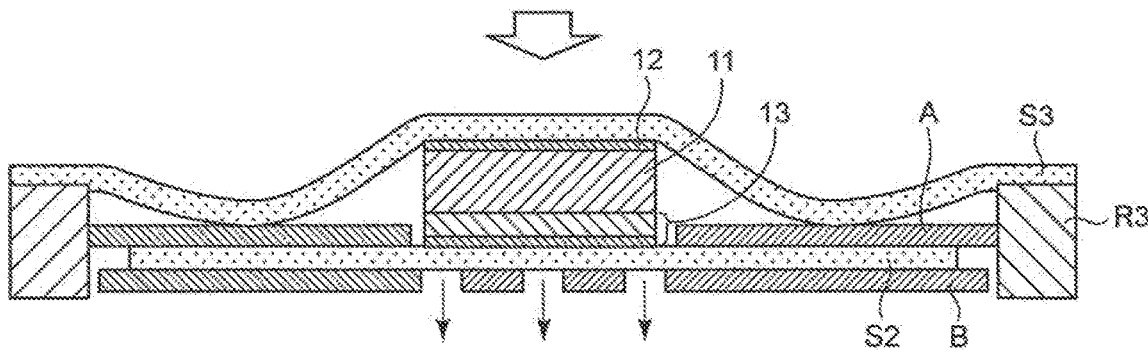
FIG. 4G is a schematic cross-sectional view illustrating a state after a second film formation step.

Second Film Formation Step S15 (see FIG. 4G)

In the second film formation step S15, the protective film 12 is formed at the wavelength conversion member 11 side by using a known film formation apparatus (for example, a sputtering apparatus). For example, in the case of an $SiO_2$ single layer, the protective film 12 is formed in a range from 0.05 μm to 0.20 μm. The protective film 12 may be formed of a single layer or a plurality of layers, but as described above, the outermost surface of the protective film 12 is preferably an oxide in order to reduce contamination due to adhesion of a resin described later. The protective film 12 is more preferably $SiO_2$.

Figure 4H:
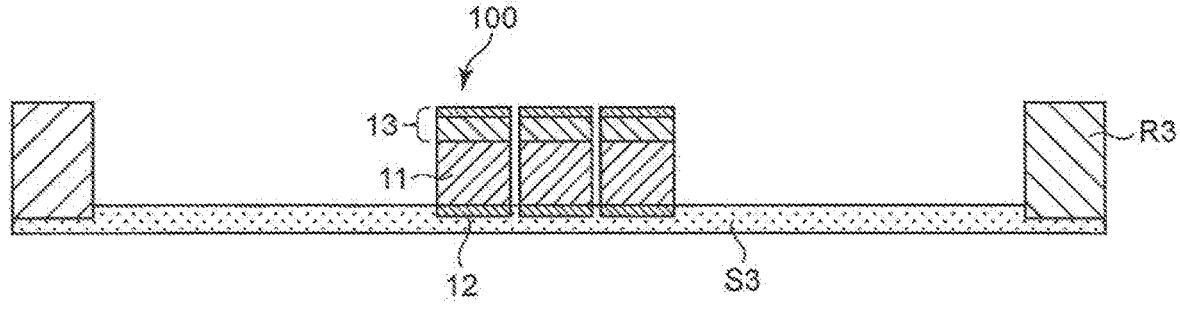
FIG. 4H is a schematic cross-sectional view illustrating a state after a dicing preparation step.

Dicing Preparation Step S16 (see FIG. 4H)

After the second film formation step S15, the adhesive sheet S2 is irradiated with UV light to reduce its adhesiveness, and then the adhesive sheet S2 is placed at a suction table B and the metal ring R2 is removed with the adhesive sheet S2 being subjected to suction. Then, an adhesive sheet S3 with a metal ring R3 is attached to the protective film 12. In this case, using a perforated separator A can hinder the adhesive sheet S3 from coming into contact with the adhesive sheet S2, or can reduce the adhesion area between the adhesive sheet S3 and the adhesive sheet S2, which makes peeling easier. Thereafter, by turning the adhesive sheet S2 upside down, peeling off the adhesive sheet S2, and then peeling off the perforated separator A, the wavelength conversion member 11 including the bonding layer 13 and the protective film 12, which are held by the metal ring R3 and the adhesive sheet S3 can be obtained. Cracking can be prevented by continuously handling the thinned wavelength conversion member on the adhesive sheet fixed to the metal ring.

Figure 4I:
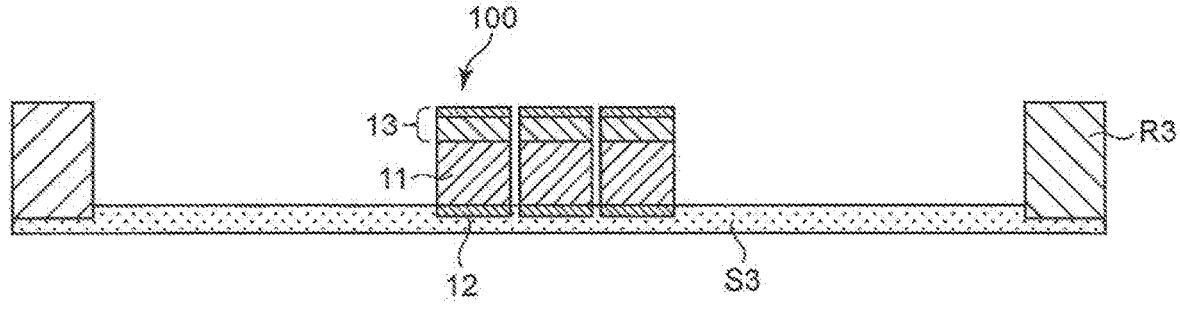
FIG. 4I is a schematic cross-sectional view illustrating a state after a dicing C) step.

Dicing Step S17 (see FIG. 4I)

After the dicing preparation step S16, the bonding layer 13 is caused to face a known dicing apparatus and dicing is performed to manufacture the wavelength conversion member 11 at which the protective film 12 and the bonding layer 13 are disposed on the upper and lower surfaces thereof. The thickness of the wavelength conversion member 11 is less than 100 μm, and the shape in plan view is, for example, a rectangular shape having a side in a range from 2 mm to 10 mm.

Figure 5:
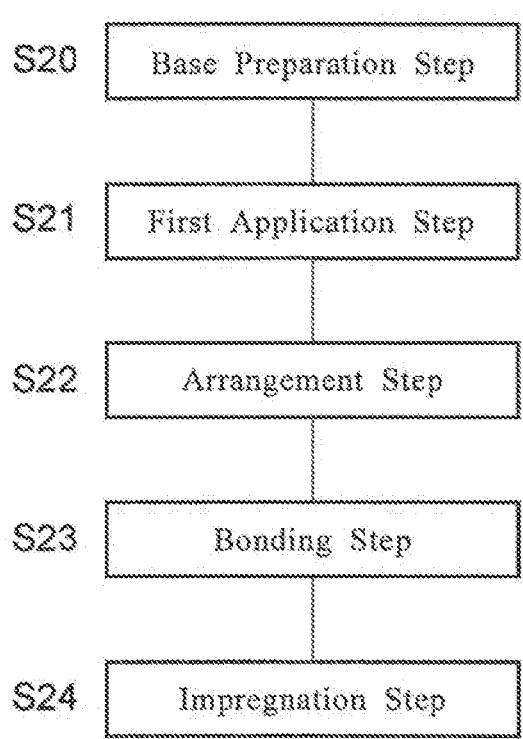
FIG. 5 is a flowchart of the manufacturing method for the wavelength conversion module.

Subsequently, a manufacturing process of the wavelength conversion module using the wavelength conversion member having a thickness of less than 100 μm will be described Manufacturing Method of Wavelength Conversion Module As illustrated in FIG. 5, the manufacturing method of the wavelength conversion module includes a base preparation step S20, a first application step S21, an arrangement step S22, a bonding step S23, and an impregnation step S24.

Base Preparation Step S20

The base preparation step S20, as an example, is a step of preparing the base 30 including the base member 31 having the recess 31a, the first metal layer 32, the second metal layer 33, and the third metal layer 34. A known processing technique may be used for forming the recess, and a known film formation method may be used for forming the first to third metal layers (for example, sputtering film formation method). Note that the base 30 is not limited to the example described above, and a protruding portion may be provided instead of the recess. Further, any one of the first metal layer 32 to the third metal layer 34 may be used, or the metal layer may not be provided.

2. First Application Step S21

First, a metal paste containing the metal powder body is prepared (1) Metal Paste Preparation In the following description, a case in which silver particles are used as the metal powder will be described, and the metal paste will be referred to as a silver paste.

(1-1) Silver Particle Preparation

The shape of the silver particles to be prepared is not particularly limited, and may be, for example, substantially spherical or flake-shaped. In addition, in the present specification, "the silver particle is substantially spherical" implies that the aspect ratio (a/b) defined by the ratio of the major axis a and the minor axis b of a silver particle is 2 or less. When the silver particles are "flake-shaped", it implies that the aspect ratio is greater than 2. The major axis a and minor axis b of the silver particles can be measured by image analysis by SEM.

The silver particles to be prepared have an average particle size of, for example, 0.3 μm or more, preferably 0.5 μm or more, more preferably 1 μm or more, and even more preferably 2 μm or more. The silver particles have an average particle size of preferably 10 μm or less, more preferably 5 μm or less. When the average particle size is 0.5 μm or more, more preferably 1 μm or more, the silver particles do not aggregate even without forming the protective film such as a capping agent on the surface of the silver particles, so the protective film does not need to be thermally decomposed and can be sintered at a low temperature. The large particle size of the silver particles improves the fluidity of the silver paste. Therefore, when the silver paste has the same fluidity (workability), the silver paste can contain more silver particles. When the average particle size is 10 μm or less, more preferably 5 μm or less, a melting point depression phenomenon occurs due to an increase in the specific surface area of the silver particles, and as a result, the sintering temperature can be lowered. The particle size of the silver particles can be measured by a laser diffraction method. In the present specification, the "average particle size" implies a volume-based median diameter measured by the laser diffraction method (a value in which the integrated volume frequency calculated from the particle size distribution is 50%).

The content of the silver particles to be prepared preferably is 5 mass % or less of silver particles having a particle size of less than 0.3 μm, and more preferably 15 mass % or less of silver particles having a particle size of 0.5 μm or less. The silver particles tend to sinter at low temperatures as the particle size decreases. In particular, nano-sized silver particles are sintered at a lower temperature than a sintering temperature of micro-sized silver particles. Therefore, a large content of the nano-sized silver particles in the silver paste will cause to start sintering at a low temperature, and the fusion may occur in a state where the silver particles are not in contact with each other.

A small amount of silver oxide film, sulfur film, etc., may be present on a surface of the silver particles to be prepared. Because silver is a noble metal, the silver particles are not easily oxidized and are very stable. However, when viewed in the nano region, silver easily adsorbs sulfur, oxygen, etc., in the air, and tends to form a thin film on the surface of the silver particles. The thickness of the oxide film or the sulfide film in the silver particles is preferably 50 nm or less, more preferably 10 un or less.

(1-2) Mixing of Silver Particles and Organic Solvent

Here, the prepared silver particles and an organic solvent as a dispersion medium are mixed. Furthermore, the silver paste may include a resin, etc. The content of the silver particles at the time of mixing is preferably 70 mass % or more, more preferably 85 mass % or more. The mixable resin is decomposed by heating during firing, which will be described later, and does not remain in the bonded body to be formed. The resin may be, for example, polystyrene (PS) or polymethyl methacrylate (PMMA). Mixing the silver particles with an organic solvent that is a dispersion medium facilitates applying the silver paste to the surface of the base at a desired thickness. The organic solvent used here may be, for example, a mixture of one organic solvent, or a mixture of two or more types of organic solvents, such as a mixture of diols and ethers. The boiling point of the organic solvent is preferably in a range from 150° C. to 250° C. When the boiling point is 150° C. or more, the contamination and the dropping of chips of silver particles by the atmosphere due to drying before the heating step can be prevented. When the boiling point is 250° C. or less, the volatilization rate in the heating step is increased, and sintering can be promoted.

In addition to the silver particles and the dispersion medium, additives such as a dispersant, a surfactant, a viscosity modifier, a diluting solvent, etc., and spacer particles, etc., may be mixed. The content of the additive in the silver paste may be such that the total amount of the additive is 5 mass % or less, such as in a range from 0.5 mass % to 3 mass %, with respect to the silver paste. In particular, by adding spacer particles, the thickness of the metal paste can be controlled with sufficient reproducibility, which makes it possible to stably impregnate the resin, which is preferable. Note that in the above description, the silver paste formed using the silver particles has been described as an example, but the present embodiment is not limited to use of the silver paste, and may use a metal paste composed of other metal particles other than the silver particles, for example, copper particles.

(2) Application of Prepared Metal Paste on Base

Here, the metal paste is applied on the base 30. Specifically, the prepared metal paste is applied on the surface defining the bottom of the recess 31*a*. As a method for applying the metal paste, a known method such as, for example, a screen printing method, an offset printing method, an ink jet printing method, a flexographic printing method, a dispenser printing method, a gravure printing method, stamping, dispense, squeegee printing, silk screen printing, spraying, brush painting, coating method, etc., can be appropriately employed. The application thickness of the metal paste can be appropriately set depending on the application, etc., and can be, for example, in a range from 1 μm to 1000 μm, preferably in a range from 5 μm to 800 μm, and more preferably in a range from 10 μm to 500 μm.

3. Arrangement Step S22

The wavelength conversion member 11 including the protective film 12 and the bonding layer 13 is placed at the metal paste applied on the surface defining the bottom of the recess 31*a*. For example, the placement is performed from the above of the metal paste, and for example, the wavelength conversion member 11 is pressed so that the metal paste between the surface defining the bottom of the recess 31*a* of the wavelength conversion member 11 has a predetermined thickness, and preferably the metal paste crawls up on a portion of the side surface of the wavelength conversion member 11.

4. Bonding Step S23

In the bonding step, the metal paste is heated to remove the organic solvent, and the metal powder is fused by sintering the metal powder body to bond the base 30 and the wavelength conversion member 11 by a metal sintered compact having a porous structure including voids. The heating and firing here may be performed in a reducing atmosphere and then in an oxidizing atmosphere, if necessary.

(1) Heating Temperature (1-1) Heating in Reducing Atmosphere

Heating in a reducing atmosphere is carried out as needed as described above, and is optional. The heating in the reducing atmosphere removes a trace amount of oxide film, etc., present on the surface of the metal powder by reduction, thereby exposing the metal atom on the surface of the metal powder to promote surface diffusion of the metal atom on the metal powder surface. Therefore, the sintering of the metal particles at a low temperature can be promoted in heating in a subsequent oxidizing atmosphere.

The heating in the reducing atmosphere and the heating in the subsequent oxidizing atmosphere may be performed in a separate apparatus, but it is preferable to perform the heating in the reducing atmosphere and the heating in the oxidizing atmosphere in the same apparatus, thereby the heating in the reducing atmosphere and the heating in the oxidizing atmosphere can be continuously carried out in the same apparatus. The reducing atmosphere is preferably an atmosphere containing a formic acid or a hydrogen-containing atmosphere, and is preferably a mixture of a formic acid or hydrogen in an inert gas such as nitrogen. The reducing atmosphere more preferably contains a formic acid, and is preferably a mixture of a formic acid with an inert gas such as nitrogen.

The heating in the reducing atmosphere is performed, for example, at lower than 300° C., preferably 280° C. or less, more preferably 260° C. or less, even more preferably 200° C. or less. The heating in the reducing atmosphere is preferably 150° C. or more, more preferably 160° C. or more, and even more preferably 180° C. or more. When the heating temperature is 150° C. or more, more preferably 160° C. or more, and even more preferably 180° C. or more, the reaction rate of the reduction reaction of the oxide film present on the surface of the silver particle can be increased. The pressure when heating in the reducing atmosphere is not particularly limited, and may be, for example, atmospheric pressure.

(1-2) Firing in Oxidizing Atmosphere

Here, by heating and firing the metal particles in an oxidizing atmosphere, the metal particles are fused to each other to form a metal sintered compact. The oxidizing atmosphere is preferably an oxygen-containing atmosphere, more preferably an atmosphere. When the oxidizing atmosphere is the oxygen-containing atmosphere, the oxygen concentration in the atmosphere is preferably in a range from 2 volume % to 21 volume %. The higher the oxygen concentration in the atmosphere, the more the surface diffusion of metal atoms is promoted on the surface of the metal particles, and the easier it is to fuse the metal particles to each other. When the oxygen concentration is 2 volume % or more, fusion can be performed at a low heating temperature, and when the oxygen concentration is 21 volume % or less, the heating apparatus does not require a pressurizing mechanism, and the process cost can be reduced.

(2) Firing Temperature

The firing temperature in the oxidizing atmosphere is, for example, 300° C. or less, preferably 280° C. or less, more preferably 260° C. or less, even more preferably 200° C. or less. When the heating in the reducing; atmosphere is performed before the firing in the oxidizing atmosphere, firing at a lower temperature becomes possible. The firing in the oxidizing atmosphere is performed at preferably 150° C. or more, more preferably 160° C. or more. By setting the firing temperature to 150° C. or more, and more preferably 160° C. or more, a metal sintered compact having a low electrical resistivity and good thermal conductivity properties can be formed. The firing in the oxidizing atmosphere may be performed by pressurization or, for example, atmospheric pressure.

4. Impregnation Step S24

In the impregnation step S24, first, a resin material including an anti-foaming agent including hydrophilic or hydrophobic particles is prepared. The prepared resin material is then defoamed by depressurization before application of the resin material. For example, a syringe is filled with resin material, and the syringe is placed in a vacuum defoamer to defoam before application. The depressurizing and defoaming in this manner can efficiently cause defoaming of the bubbles that cannot be levitated due to their extremely small size and low buoyancy, which are contained during the preparation of the resin material and the filling into the syringe. For example, the vacuum level during the defoaming is set, for example, in a range from $10^3$ Pa to $10^{-3}$ Pa, preferably in a range from $10^2$ Pa to $10^{-2}$ Pa, and more preferably in a range from 10 Pa to $10^{-1}$ Pa. Further, since the resin material used in this manufacturing method contains an anti-foaming agent, large bubbles are suppressed from being formed and defoamed even when the pressure is reduced in the defoaming step, and for example, spillage from a syringe can be prevented.

The defoamed resin material is then applied to the surface of the metal sintered compact. The amount of resin to be applied is set to be greater than or equal to the amount of the resin when filled into the entire voids of the metal sintered compact. Specifically, for example, the amount of resin to be applied is determined to be the volume of the voids of the metal sintered compact based on the sintering density of the metal sintered compact and the entire volume of the metal sintered compact, and set to be greater than or equal to the void volume. Here, in consideration of filling the voids of the metal sintered compact, the resin material to be applied preferably has a low viscosity, but reducing of viscosity causes the following problems. For example, when a metal sintered compact is used as the bonding member, the surface of the metal sintered compact to be applied is typically inclined rather than horizontal. In such a case, the applied resin material may spread horizontally and reach an area where the resin material such as a wire pad should not be applied. Therefore, it is preferable to devise a method for reduce the spread of the applied resin material in the horizontal direction. In the example herein, the resin material subjected to defoaming by a syringe is applied into the recess 31a located outward of the wavelength conversion member 11 that is, in a region between the side surface of the recess 31a and the surface of the fillet. As described above, the resin may be positioned at the outer peripheral portion 12e of the outermost surface of the protective film 12 (see FIGS. 1 to 3B). In this manner, by providing the resin to the outer peripheral portion 12e of the outermost surface of the protective film, the bonding area can be increased, and thus it can be more firmly bonded. The resin of the outermost surface of the protective film may be in other form, and the resin is not necessarily positioned at the outermost surface of the protective film.

Subsequently, the resin material applied to the surface of the metal sintered compact (the surface of the fillet) is depressurized to discharge the gas in the voids, and then the voids are impregnated with the resin material. The vacuum level at the time of impregnation is appropriately adjusted so that the entire voids are impregnated with the resin material while suppressing excessive foaming, based on the volume fraction of the voids and the size of the voids in the metal sintered compact, but the vacuum level at the time of impregnation is set, for example, in a range from $10^3$ Pa to $10^{-3}$ Pa, preferably in a range from $10^2$ Pa to $10^{-2}$ Pa, and more preferably in a range from 10 Pa to $10^{-1}$ Pa. An amount of the air remaining under the chip in the resin coating step is great to some extent, and thus the air floats by its own buoyancy, so unlike the defoaming step, the air escapes from under the chip even at normal pressure to some extent. However, depressurization is required because the air cannot be completely removed. In this manufacturing method, since the resin material contains an anti-foaming agent having hydrophilic or hydrophobic particles, even depressurized after applying the resin material, the gas in the voids is defoamed as small bubbles without growing into large bubbles on the surface of the resin material. In this manner, excessive foaming can be suppressed, the gas in the voids can be removed, and the scattering of the resin material or the unnecessary spread of the resin material can be suppressed. Furthermore, since the foam contained in the resin material itself is removed by depressurization before application, foaming of the resin material due to the resin material can be suppressed. The hydrophilic or hydrophobic particles (powder) contained in the anti-foaming agent are particles, the particles do not easily penetrate into the central portion of the voids of the metal sintered compact, and do not need to penetrate into the central portion. In other words, even when the resin material is held near the surface of the metal sintered compact to which the resin material is applied, the foam suppressor function or the foam-breaking function by the particles is exhibited in the vicinity of the surface of the metal sintered compact, and excessive foaming of the resin material is suppressed.

The resin material impregnated in the voids is cured by heating. In this manner, the wavelength conversion module according to the present embodiment is fabricated.

EXAMPLES

Example 1

In Example 1, the wavelength conversion module 100 illustrated in FIG. 3A was fabricated as follows.

(1) Provision of Base 30

The base 30 having the recess 31a is provided, in which a Ni plating layer having a thickness of 2 μm as the first metal layer 32, and an Au plating layer having a thickness of 0.05 μm as the second metal layer 33 are provided at the base member 31 formed of copper. On this base 30, a metal mask was used to foam Ag having a thickness of 0.5 μm as the third metal layer 34 at the surface defining the bottom of the recess 31a by sputtering.

(2) Fabrication of Wavelength Conversion Member 11

Here, first, a YAG plate having a thickness of 0.20 mm was prepared as the wavelength conversion member 11. Here, the composition of the YAG plate prepared is $(Y_{0.9967}Ce_{0.0033})_3Al_5O_{12}$.

Then, a bonding layer was formed at the lower surface of the YAG plate by sputtering in the order of an $Al_2O_3$ film (0.7 μm thickness) and an Ag film (0.5 μm thickness).

Subsequently, the UV curable dicing tape was attached to the Ag film side as the adhesive sheet S1, and the thickness of the wavelength conversion member 11 was processed to 63.5 μm in the grinding polishing step. Then, the adhesive sheet S1 was irradiated with UV to remove the adhesive, and a non-UV type dicing tape was attached to the YAG side, and then the adhesive sheet S1 was peeled off.

Subsequently, the UV curable dicing tape was attached to the Ag film side as the adhesive sheet S2, and then the non-UV type dicing tape was peeled off. A wavelength conversion member plate in which a plurality of the wavelength conversion members 11 are integrated was fabricated by forming an $SiO_2$ film having a thickness of 0.11 μm together with the pressure-sensitive adhesive sheet S2 on the upper surface of the YAG plate by sputtering.

Subsequently, the adhesive sheet S2 was irradiated with UV to remove the adhesive, and a UV curable dicing tape was attached to the $SiO_2$ film side as the adhesive sheet S3, and then the adhesive sheet S2 was peeled off. The wavelength conversion member plate in a state of being attached to the adhesive sheet S3 was individualized by dicing to fabricate the wavelength conversion member 11 of 5.5 mm×5.5 mm×63.5 μm.

(3) Preparation and Application of Metal Paste, Arrangement of Wavelength Conversion Member A silver paste was prepared as a metal paste for bonding the wavelength conversion member 11 and the base 30. For the silver paste, first, the organic solvents 2-ethyl-1,3-hexanediol (0.852 g), diethylene glycol monobutyl ether (0.213 g), and anionic liquid surfactant (0.150 g) were stirred with a rotation/revolution mixer for 1 minute, and then a cycle of defoaming for 15 seconds was used for 1 cycle to obtain a solvent mixture.

Subsequently, the flake-shaped silver particles (13.776 g) and the zirconia particles (0.009 g) having a particle size of 100 μm as spacer particles were weighed and added to the solvent mixture. The obtained mixture was stirred with a rotation/revolution mixer for 1 minute and defoaming for 15 seconds for 1 cycle to obtain a resin-free silver paste. Subsequently, the prepared silver paste was applied to the surface defining the bottom of the recess 31a of the base 30.

The wavelength conversion member 11 was disposed at the applied silver paste with a die bonder.

(4) Bonding

The base 30 at which the wavelength conversion member is disposed is placed in an oven and fired to sinter the silver powder contained in the fired silver paste in the atmosphere, thereby bonding the base 30 and the wavelength conversion member 11. The firing temperature was raised to 200° C. at a heating rate of 0.24° C./min and held at 200° C. for 1 hour to sinter the silver powder.

(5) Resin Impregnation

First, as an impregnating resin, a foam suppressor silicone oil compound type (including silica particles) anti-foaming agent (0.005 g, 0.1%) is added to an alicyclic epoxy resin (thermosetting type, 5.000 g) to fabricate the resin material.

(6) Defoaming before Application of Resin Material

The syringe for application is filled with the prepared resin material, and the resin material together with the entire syringe was defoamed with a vacuum defoamer. Defoaming was performed under the condition of 30 seconds using an oil rotary vacuum pump having an ultimate vacuum degree of 0.67 Pa.

(7) Application of Resin Material

The resin material was applied to the recess 31a using a syringe containing the resin material after defoaming. Specifically, by filling the resin material between the inner peripheral wall of the recess 31a and the outer peripheral side surface of the wavelength conversion member, the resin material was applied to the surface of the fillet formed around the wavelength conversion member of the silver sintered compact.

(8) Impregnation of Resin Material

After the resin material was applied, the base 30 to which the wavelength conversion member 11 was bonded was depressurized in a vacuum defoamer to remove the air from the voids of the silver sintered compact, and impregnated with the resin material. Depressurization was performed under the condition of 10 minutes using an oil rotary vacuum pump having an ultimate vacuum degree of 0.67 Pa.

(9) Curing of Resin

The entire base 30 bonded to the wavelength conversion member 11 was heated to 130° C. for 3 hours using an oven in the atmosphere, and the resin material was cured to obtain the wavelength conversion module.

Example 2

The wavelength conversion module was obtained in the same manner as in Example 1 except for setting the thickness of the wavelength conversion member 11 to 75.5 μm.

Example 3

The wavelength conversion module was obtained in the same manner as in Example 1 except for setting the thickness of the wavelength conversion member 11 to 87.0 μm.

Example 4

The wavelength conversion module was obtained in the same manner as in Example 1 except for setting the thickness of the wavelength conversion member 11 to 90.0 μm.

Comparative Example 1

The wavelength conversion module was obtained in the same manner as in Example 1 except for setting the thickness of the wavelength conversion member 11 to 150.0 μm.

Comparative Example 2

The wavelength conversion module was obtained in the same manner as in Example 1 except for setting the thickness of the wavelength conversion member 11 to 200.0 μm.

Such a small wavelength conversion member that is not ring-shaped is used by being irradiated with laser by fixing it without rotation (fixed type). Accordingly, the laser continues to be irradiated to the same place, so that the temperature tends to rise. Thus, it is important how high the output of the laser irradiation can be (upper limit excitation input). In the rotary type, the fluorescence efficiency (=fluorescence output×100/excitation input), which is the ratio of the total amount of fluorescent light generated (fluorescence output) to the incident laser output (excitation input), and the illumination efficiency (=illumination output×100/fluorescence output), which is the ratio of the amount of light (illumination output) that the generated fluorescence is extracted from the projector device through the secondary lens diameter, are important. The product of these efficiencies is the total efficiency (=fluorescence efficiency×illumination efficiency). However, as described above, in the fixed type, the upper limit excitation input is also an important factor, and the upper limit of amount of light, which is the maximum amount of light extracted from the projector device, is fluorescence efficiency×illumination efficiency× upper limit excitation input. The evaluation method for each of the evaluation items will be described below.

Fluorescence Efficiency

For the evaluation of the fluorescence efficiency for the wavelength conversion members of each Example and Comparative Example, the wavelength conversion members were irradiated with laser light from a laser diode having a wavelength of 450 nm with an intensity of 10 W through a dichroic mirror so that the light diameter of the incident light was 0.25 mm², and the light was incident on the wavelength conversion member. Then, the radiant flux of the light emitted from the same surface as the surface on which the laser light was incident was separated by a dichroic mirror and measured by an integrating sphere. The wavelength conversion member is water-cooled and does not degrade. The radiant flux of Comparative Example 2 was set to 100%, and the radiant flux obtained by measuring the samples of the wavelength conversion members of Examples 1 to 4 and Comparative Example 1 with respect to the radiant flux of Comparative Example 2 was represented as the fluorescence efficiency (%).

Illumination Efficiency

The wavelength conversion members of each Example and Comparative Example were irradiated with laser light by laser diodes having a wavelength of 455 nm. This irradiation was performed so that the light diameter of the incident light was 0.6 mm on the upper surface of the wavelength conversion member on which the laser light was incident. Subsequently, light emitted from the same surface as the upper surface of the wavelength conversion member on which the laser light was incident was measured by the following method. The emission luminance of the light emitted from the wavelength conversion member of each Example and Comparative Example was measured by a color luminance meter, and the measurements were made by setting the position indicating the maximum luminance in the obtained emission spectrum as the center (measurement center), and by setting the distance (mm) from the measurement center at two positions having a luminance (¹⁄₁₀₀ luminance) which is ¹⁄₁₀₀ of the maximum luminance in the emission spectrum as an absolute value. Then, the sum of the absolute values of the distances (mm) between the two positions from the measurement center was calculated. This sink and air cooling fan. Because the heat generated by the wavelength conversion member depends on the laser spot size, the wavelength conversion module was evaluated based on the upper limit excitation input [W/mm²] obtained by dividing the laser output [W] when the phosphor melted by the area [mm²] of the laser spot. Here, the laser spot size of Examples and Comparative Examples was 1.29 mm×2.67 mm (3.44 mm²).

Upper Limit of Amount of Light

For the upper limit of amount of light, the product of the fluorescence efficiency, illumination efficiency, and the upper limit excitation input that are measured above for each sample is calculated, and the product of each wavelength conversion member of Examples 1 to 4 and Comparative Example 1 with respect to the upper limit of amount of light of Comparative Example 2 is expressed as the upper limit of amount of light (%), by setting the product of Comparative Example 2 as 100%.

Relative Density

Figure 6:
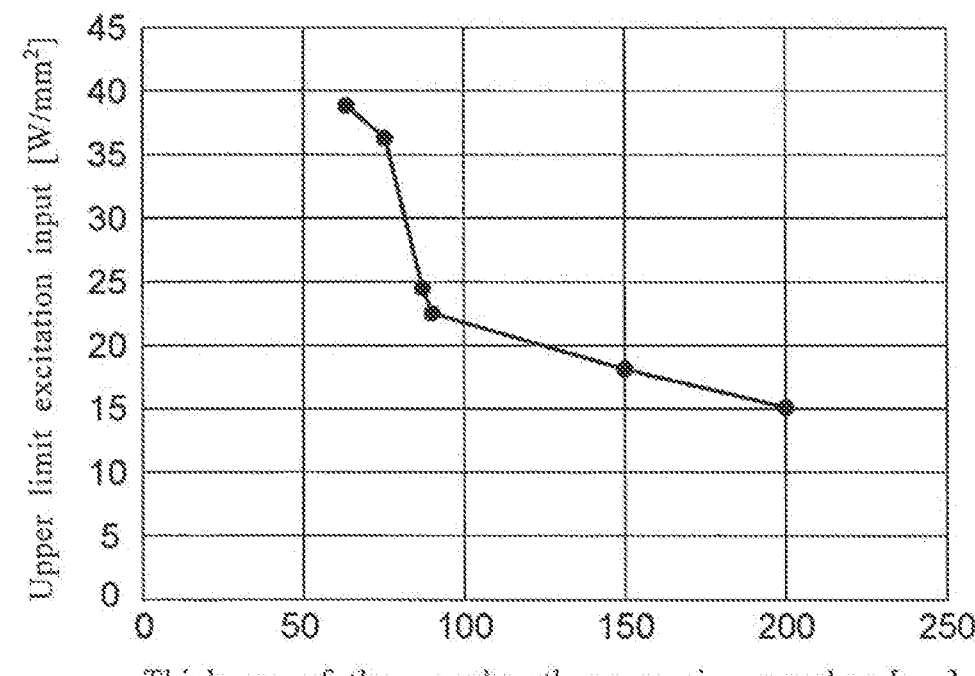
FIG. 6 is a graph showing a relationship between an upper limit excitation input and a thickness of the wavelength conversion member in the wavelength conversion module according to the present disclosure.

The relative density of each wavelength conversion member was measured at a stage in which the YAG plate was prepared. The relative density was confirmed because it could affect each evaluation item. The relative density was calculated from mass and volume (Archimedes method) as described above. The evaluation results are shown in Table 1 and FIG. 6 below.

TABLE 1

| | Thickness of wavelength conversion member (μm) | Relative density of wavelength conversion member (%) | Fluorescence efficiency (%) | Illumination efficiency (%) | Upper limit excitation input (W/mm²) | Upper limit of amount of light (%) |
|---|---|---|---|---|---|---|
| Example 1 | 63.5 | 97.2 | 85 | 59.8 | 38.87 | 243 |
| Example 2 | 75.5 | 97.2 | 87 | 59.7 | 36.29 | 231 |
| Example 3 | 87.0 | 97.2 | 83 | 59.6 | 24.50 | 149 |
| Example 4 | 90.0 | 96.3 | 95 | 60.0 | 22.53 | 158 |
| Comparative Example 1 | 150.0 | 97.4 | 86 | 57.3 | 18.13 | 110 |
| Comparative Example 2 | 200.0 | 97.4 | 100 | 54.1 | 15.06 | 100 | numerical value is referred to as 1% width (mm), The smaller this numerical value is, the lighter the light is emitted in a narrow area (point light source), the easier it is for light to enter the secondary optical system, and the higher the Illumination efficiency. It has been found that comparing the obtained numerical values with the illumination efficiency measured in the general actual secondary optical system (=illumination output×100/fluorescence output) can be approximated by the following equation.

$$\text{Illumination efficiency}=-0.0012x^2+0.1243x+58.783$$

(x:=1% width)

Using this equation, the 1% width of the sample of each wavelength conversion member was measured, and the illumination efficiency was calculated.

Upper Limit Excitation Input

Laser irradiation with a predetermined output [W] is directly performed from above the wavelength conversion member of each Example and Comparative Example, and the laser output is gradually increased, and at the same time, part of the fluorescence output is measured, thereby measuring the laser output [W] when the phosphor melted due to the heat generated by the wavelength conversion member and the fluorescence output decreased. The wavelength conversion member is cooled with a typical aluminum heat According to Table 1 and FIG. 6, in the wavelength conversion module in which the thickness of the wavelength conversion member described in Examples 1 to 4 is less than 100 μm, the result that the value of the upper limit excitation input is high was obtained compared with the wavelength conversion module having a thickness of 100 μm or more of the wavelength conversion member described in Comparative Examples 1 and 2. That is, even if the excitation input was about 20 W/mm², the fluorescence output did not decrease in Examples 1 to 4, but in Comparative Examples 1 and 2, the phosphor melted and the fluorescence output decreased. With the laser light entered from above, the outermost surface of the upper surface of the wavelength conversion member irradiated with the laser light has the highest temperature. However, because the thermal conductivity of the wavelength conversion member itself is not high, when the wavelength conversion member is 100 μm or more, heat is less likely to be transferred to the lower metal member, and the outermost surface of the wavelength conversion member has considerably a high temperature, and in some cases, it may be melted. On the other hand, by setting the wavelength conversion member to less than 100 μm, such as, for example, 95 μm or less, preferably 90 μm or less, the heat generated by the laser light in the portion of the wavelength conversion member irradiated with laser light can be conducted to the lower metal member, and melting of the wavelength conversion member can be reduced. In this manner, it is considered that the thickness of the wavelength conversion member is set to be within a predetermined range, which hinders a sudden increase in temperature in the wavelength conversion member, and the upper limit excitation input has improved.

On the other hand, it was found that there was no significant variation in the fluorescence efficiency and the illumination efficiency, and the correlation thereof with the thickness was weak. Also, although the density was also low only in Example 4, the effect was also minor compared to the thickness.

Note that the implementations disclosed in the present disclosure are illustrative in all respects and are not the basis of limiting interpretation. Therefore, the technical scope of the present invention is not construed solely by the implementations described above, but is defined based on the description of the scope of claims. In addition, the technical scope of the present invention includes all modifications within the meaning and scope equivalent to the scope of claims.

The resin impregnation method according to the present embodiment can be used for fixing a semiconductor element, a submount substrate, etc. Further, the wavelength conversion module and the manufacturing method thereof can be used for headlights of automobiles, illumination fixtures, projectors, etc.

What is claimed is:

1. A wavelength conversion module comprising:
a base;
a wavelength conversion member consisting of a phosphor; and
a bonding member including a metal part, the bonding member bonding the base and the wavelength conversion member, wherein
a thickness of the wavelength conversion member is less than 95 μm, wherein
the wavelength conversion member is formed of a polycrystalline body, and
the metal part of the bonding member is a metal sintered compact having a porous structure defining voids.

2. The wavelength conversion module according to claim 1, wherein
the bonding member further includes a resin part.

3. The wavelength conversion module according to claim 2, wherein
the resin part includes
a first resin portion covering an outer surface of the metal sintered compact, and
second resin portions impregnated in the voids,
the first resin portion and the second resin portions being made of the same resin material.

4. The wavelength conversion module according to claim 3, wherein
the first resin portion is located at a side surface of the wavelength conversion member.

5. The wavelength conversion module according to claim 1, further comprising
a protective film disposed on the wavelength conversion member.

6. The wavelength conversion module according to claim 5, wherein
an outermost surface of the protective film is formed of an oxide.

7. The wavelength conversion module according to claim 5, wherein the bonding member further includes a resin part disposed at an outer peripheral portion of the outermost surface of the protective film.

8. The wavelength conversion module according to claim 1, further comprising
a bonding layer disposed under the wavelength conversion member between the wavelength conversion member and the bonding member.

9. The wavelength conversion module according to claim 1, wherein
the phosphor is a rare earth aluminate sintered compact having a composition represented by Formula (I), $$(Ln_{1-n}Ce_n)_3(Al_{1-m}M_m^1)_5O_{12} \tag{I}$$

wherein, Ln is at least one rare earth element selected from the group consisting of Y, La, Lu, Gd, and Tb, $M^1$ is at least one element selected from Ga and Sc, and m and n are numbers satisfying $0 \leq m \leq 0.02$ and $0.0017 \leq n \leq 0.0170$ respectively.

10. The wavelength conversion module according to claim 9, wherein
a Ce content (mol %) of the phosphor is calculated by $n \times 3 \times 100/(3+5+12)$, and is in a range from 0.025 mol % to 0.255 mol %.

11. A wavelength conversion module comprising:
a base;
a wavelength conversion member consisting of a phosphor;
a bonding member including a metal part, the bonding member bonding the base and the wavelength conversion member; and
a protective film disposed on the wavelength conversion member, wherein
a thickness of the wavelength conversion member is less than 100 μm, and
the bonding member further includes a resin part disposed at an outer peripheral portion of the outermost surface of the protective film.

12. The wavelength conversion module according to claim 11, wherein
the wavelength conversion member is formed of a polycrystalline body.

13. The wavelength conversion module according to claim 11, wherein
the metal part of the bonding member is a metal sintered compact having a porous structure defining voids.

14. The wavelength conversion module according to claim 13, wherein:
the resin part includes
a first resin portion covering an outer surface of the metal sintered compact, and
second resin portions impregnated in the voids,
the first resin portion and the second resin portions being made of the same resin material.

15. The wavelength conversion module according to claim 14, wherein
the first resin portion is located at a side surface of the wavelength conversion member.

16. The wavelength conversion module according to claim 11, wherein an outermost surface of the protective film is formed of an oxide.

17. The wavelength conversion module according to claim 11, further comprising a bonding layer disposed under the wavelength conversion member between the wavelength conversion member and the bonding member.

18. The wavelength conversion module according to claim 11, wherein the phosphor is a rare earth aluminate sintered compact having a composition represented by Formula (1), $$(Ln_{1-n}Ce_n)_3(Al_{1-m}M^1_m)_5O_{12} \tag{I}$$

wherein, Ln is at least one rare earth element selected from the group consisting of Y, La, Lu, Gd, and Tb, M1 is at least one element selected from Ga and Sc, and m and n are numbers satisfying $0 \le m \le 0.02$ and $0.0017 \le n \le 0.0170$ respectively.

19. The wavelength conversion module according to claim 18, wherein a Ce content (mol %) of the phosphor is calculated by $n \times 3 \times 100/(3+5+12)$, and is in a range from 0.025 mol % to 0.255 mol %.

* * * * *